United States Patent
Tsai et al.

(10) Patent No.: US 6,878,639 B1
(45) Date of Patent: Apr. 12, 2005

(54) BORDERLESS INTERCONNECTION PROCESS

(75) Inventors: Ming-Huan Tsai, Hsin-Chu (TW);
Ru-Chian Chiang, Hsin-Chu (TW);
Hun-Jan Tao, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 24 days.

(21) Appl. No.: 10/667,013

(22) Filed: Sep. 19, 2003

(51) Int. Cl.[7] .............................................. H01L 21/302
(52) U.S. Cl. ..................... 438/740; 438/637; 438/709; 438/738
(58) Field of Search ................................ 438/740, 637, 438/709, 738

(56) References Cited

U.S. PATENT DOCUMENTS 5,286,344 A * 2/1994 Blalock et al. ............. 438/723
6,265,271 B1 * 7/2001 Thei et al. ................. 438/296
6,497,993 B1   12/2002 Chiu et al.

FOREIGN PATENT DOCUMENTS

| TW | 378392 | 1/2000 |
|----|--------|--------|
| TW | 455983 | 9/2001 |

* cited by examiner

Primary Examiner—Luan Thai
(74) Attorney, Agent, or Firm—Haynes and Boone, LLP

(57) ABSTRACT

A new method for fabricating a borderless interconnection in a semiconductor device is provided. During fabrication, the device includes an interlevel dielectric (ILD) layer, a metal silicide layer, and a stop layer disposed between the ILD and metal silicide layers. The stop layer may be formed of silicon nitride or silicon oxynitride, and the metal silicide layer may be a nickel silicide. The method includes etching the ILD layer to expose at least a portion of the stop layer and then performing a nitrogen plasma treatment on the exposed portion of the stop layer. After the treatment, the exposed portion of the stop layer is removed to provide the interconnection hole. Because of the plasma treatment, damage to the metal silicide underlying the stop layer will be minimized when the stop layer is removed.

26 Claims, 4 Drawing Sheets

BORDERLESS INTERCONNECTION PROCESS

BACKGROUND

The present disclosure relates generally to the field of fabricating integrated circuit devices on semiconductor substrates and, more particularly, to fabricating borderless interconnections for submicron integrated circuit technologies.

An integrated circuit (IC) is formed by creating one or more devices (e.g., circuit components) on a substrate using a fabrication process. The IC's active device density (e.g., the number of devices per IC area), as well as the IC's functional density (e.g., the number of interconnected devices per IC area), are limited by the fabrication process.

An IC fabrication process generally has a number of limitations that affect the formation of a device. One of these limitations is a minimum feature size, which may be viewed as the smallest component (or line) that can be created using the process. Generally, as the feature size of the fabrication process decreases, the active device density of IC's created using the fabrication process increases because more devices may be placed on the IC. However, the devices need to be connected and, as IC technology has moved towards submicron levels, increases in functional density have become interconnection limited. This limitation presents challenges in terms of designing interconnections, identifying suitable materials for use in such interconnections, and developing processing techniques for interconnections, especially for IC generations with increasingly small feature sizes (e.g., below 0.13 $\mu$m).

An IC may include two types of vertical interconnections. Vertical interconnections that connect a metal layer and devices formed in the IC's substrate are generally referred to as "contacts." Vertical interconnections that connect an upper metal layer with lower metal layers are generally referred to as "vias." One difficulty in IC fabrication is making the vertical interconnections align with the features with which they are to connect. Misalignment between the vertical interconnections and the features may cause reliability issues, defects, or even failure, depending on the severity of the misalignment.

One way to increase the likelihood that a vertical interconnection is aligned with a feature is to make the feature larger than the opening of the associated contact or via. This is accomplished by creating a "border" around the contact or via opening. However, the border has an impact on the functional density of the IC, as it takes up additional space. Although some methods have been developed to eliminate the border while maintaining the needed vertical alignment, none of them are satisfactory. For example, some processes may damage one or more layers of the IC when plasma-based removal techniques are used to remove layers during fabrication. Such damage may include junction damage and contact resistance degradation in layers below the layer being removed.

Accordingly, what is needed is an improved system and method for fabricating borderless interconnections for submicron integrated circuit technologies. For example, it is desirable to fabricate borderless connections while minimizing or eliminating plasma associated damage. It is also desirable to fabricate borderless interconnections to increase the integration level and functional density of ICs.

SUMMARY

In one embodiment, the present disclosure relates a method for forming an opening. The method comprises providing a dielectric layer on a substrate and forming a patterned photoresist layer on the dielectric layer, wherein at least a portion of the dielectric layer is exposed through the patterned photoresist layer. The exposed portion of the dielectric layer is etched, and a plasma treatment is performed on the photoresist layer using a nitrogen-based gas. A wet strip is performed to remove the patterned photoresist layer.

In another embodiment, the present disclosure relates to a new method for fabricating a borderless interconnection in a semiconductor device, wherein the device includes a photoresist layer defining a contact mask, an interlevel dielectric (ILD) layer, a stop layer, and a metal silicide layer. The method comprises etching the ILD layer to expose at least a portion of the stop layer, wherein the etching is guided by the contact mask, and performing a plasma treatment on the exposed portion of the stop layer. At least the exposed portion of the stop layer is removed to expose a portion of the metal silicide layer and the photoresist is stripped. A barrier layer is deposited over the exposed portion of the metal silicide layer, and any layers above the ILD layer are planarized to expose the ILD layer.

In still another embodiment, a method for fabricating an opening in a semiconductor device is provided, wherein the device includes upper, middle, and lower layers. The method comprises removing at least a portion of the upper layer to expose a corresponding portion of the middle layer, performing a plasma treatment on the exposed portion of the middle layer using a nitrogen-based plasma, and removing the exposed portion of the middle layer using a wet strip process. Damage to the lower layer is minimized due to the plasma treatment.

In yet another embodiment, a method for minimizing damage to a semiconductor device while making an opening in the device is provided, wherein the device includes a stop layer that is contiguous with an underlying metal silicide layer. The method comprises applying a nitrogen plasma treatment to at least a portion of the stop layer, and removing the treated portion of the stop layer to expose a portion of the underlying metal silicide layer. The plasma treatment reduces damage to the underlying metal silicide layer that occurs during the removing of the treated portion of the stop layer.

DETAILED DESCRIPTION

Figure 1A:
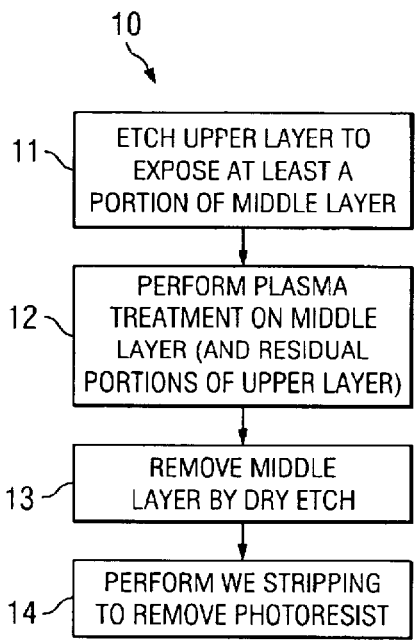
FIG. 1A is a flow chart of one embodiment of a method for using a plasma treatment during a fabrication process to minimize damage during later plasma etching.

The present disclosure relates generally to the field of fabricating integrated circuit devices on semiconductor substrates and, more particularly, to fabricating borderless interconnections for submicron integrated circuit technologies. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1A, in one embodiment, a method 10 may be used to fabricate a borderless vertical interconnection (e.g., a contact or via) for a semiconductor device, as will be described later in greater detail. It is understood that, while the present disclosure uses the fabrication of borderless interconnections for purposes of illustration, the disclosure may be applied to many other fabrication processes. In the present example, during fabrication, the device includes upper, middle, and lower layers that are deposited on a substrate. Such deposition may be accomplished using one of many processes known in the art. A layer of photoresist may be provided on the upper layer to define a pattern that prevents selected areas of the upper layer from being etched. It is understood that the device may have additional layers that are not shown.

In step 11, the upper layer is etched according to the pattern defined by the photoresist to expose at least a portion of the middle layer. The etching process may leave contaminants in the form of residual material. For example, the etching may be limited to a specific period of time to prevent damaging the middle layer, but the upper layer may not be completely etched during that time due to difficulties in uniformly etching the upper layer.

In step 12, a plasma treatment is performed on the middle layer. The plasma treatment may also affect any residual material left by the etching of step 12. The plasma treatment may, for example, degrade the residual material, and may also stabilize the middle and/or lower layers. In step 13, the middle layer is removed using a dry etching process. Due to the plasma treatment of step 12, the removal of the middle layer may be accomplished relatively quickly, which reduces damage to the lower layer that might otherwise occur during the removal of the middle layer. For example, if the plasma treatment degraded the residual matter, the middle layer may be removed more quickly than if the residual material was not first degraded. In step 14, the photoresist may be removed by wet stripping, which further reduces harm to the lower layer.

Figure 1B:
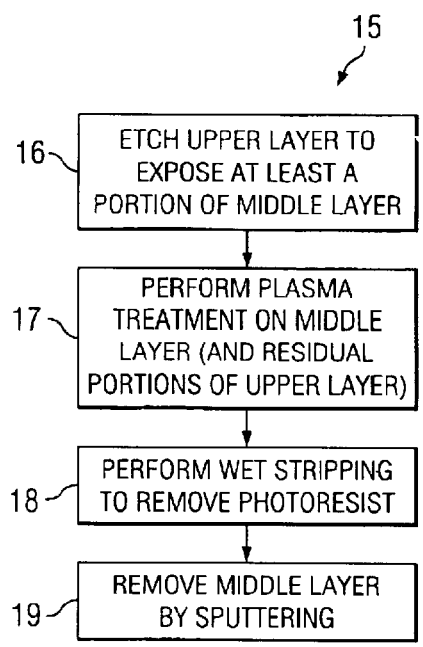
FIG. 1B is a flow chart of another embodiment of a method for using a plasma treatment during a fabrication process to minimize damage during later plasma etching.

Referring to FIG. 1B, in another embodiment, a method 15 may be used to fabricate a borderless vertical interconnection for a semiconductor device. In the present example, during fabrication, the device includes upper, middle, and lower layers that are deposited on a substrate. A layer of photoresist may be provided on the upper layer to define a pattern that prevents selected areas of the upper layer from being etched. It is understood that the device may have additional layers that are not shown.

In step 16, the upper layer is etched according to the pattern defined by the photoresist to expose at least a portion of the middle layer. The etching process may leave contaminants in the form of residual material. In step 17, a plasma treatment is performed on the middle layer. The plasma treatment may also affect any residual material left by the etching of step 16. The plasma treatment may, for example, degrade the residual material, and may also stabilize the middle and/or lower layers. In step 18, the photoresist may be removed by wet stripping and, in step 19, the middle layer may be removed using a sputtering process, such as argon sputtering.

Figure 2:
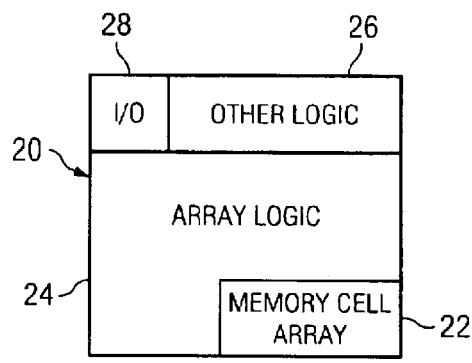
FIG. 2 is a block diagram of one embodiment of an integrated circuit that may be fabricated using the methods of FIGS. 1A and 1B.

Referring now to FIG. 2, an integrated circuit (IC) 20 is one example of a circuit that may be fabricated using the method 10 of FIG. 1. The IC 20 includes a memory cell array 22 that can be controlled by an array logic 24 through an interface (not shown). It is well known in the art that various logic circuitry, such as row and column decoders and sense amplifiers, can be included in the array logic 24, and that the interface may include one or more bit lines, gate lines, digit lines, control lines, word lines, and other communication paths to interconnect the memory cell array 22 with the array logic 24. The IC 20 can further include other logic 26 such as counters, clock circuits, and processing circuits, and input/output circuitry 28 such as buffers and drivers.

A plurality of interconnections (not shown) may exist inside of and between the memory cell array 22, the array logic 24, the interface, and the other logic 26. These connections may be either vertical or horizontal. The vertical connections may be either contacts (e.g., vertical connections that connect a metal layer and devices formed in the IC's substrate) or vias (e.g., vertical connections that connect an upper metal layer with lower metal layers), both of which are referred to hereinafter as interconnections.

One method for forming a borderless interconnection on a semiconductor device, such as the device 20 of FIG. 2, is described in U.S. Pat. No. 6,497,993 to Chiu, et al. (hereinafter referred to as "Chiu '993"), entitled "IN SITU DRY ETCHING PROCEDURE TO FORM A BORDERLESS CONTACT HOLE," which is assigned to the same assignee as the present invention and hereby incorporated by reference as if reproduced in its entirety. The disclosed process includes depositing three layers: a first layer comprising an underlying silicon nitride or silicon oxynitride as an etch stop layer on top of metal silicide, a second layer comprising silicon oxide as an interlevel dielectric layer (ILD), and a third layer comprising an overlying silicon nitride or silicon oxynitride as an anti-reflective coating (ARC) to optimize the resolution of the photolithographic processing.

In the photolithography and dry etch processing disclosed in Chiu '993, photoresist is removed by ashing (e.g., oxidizing) in an oxygen-contained plasma. The etch stop layer is removed by dry etching with an oxygen-contained plasma. This dry etching may cause plasma damage to the underlying metal silicide, resulting in junction leakage and contact resistance degradation.

Junction leakage is caused by the bombardment of wafer surfaces by energetic ions. The ions strike the substrate to produce lattice damage, such as dislocation and stacking faults.

Contact resistance degradation is related to the use of metal silicide. To reduce the resistivity of an interconnection, a refractory metal silicide may be formed on a doped polysilicon layer, typically referred to as a polycide, and on source/drain contact areas. Such metal silicide reduces the resistance of the contact interface and provides a reliable polysilicon/silicon oxide interface. Various metal silicides may be employed, such as titanium, tungsten, cobalt, and nickel. However, nickel offers particular advantages over other metals in silicide technology, especially for ICs with a feature size below 0.13 $\mu$m. One such advantage is that nickel generally has a lower thermal budget than other metal silicides. This is because nickel silicide (NiSi) may be formed in a single heating step at a relatively low temperature of about 250° C. to about 600° C., with an attendant reduction in the consumption of silicon in the substrate. This enables the formation of ultra-shallow source/drain junctions.

However, metal silicide is relatively easily damaged by oxygen-contained plasma during resist ashing or etch stop layer removal using dry etching. Resist ashing is oxidizing (burning) in an oxygen plasma system. Such damage may degrade contact resistance or may cause failures due to open contacts, depending on the severity of the damage. In addition, the dry etch process of resist ashing is subject to contamination from a number of sources, such as polymeric residue from the etch process, deposition of nonvolatile contaminants from sputtering associated with the etching process, and particulate contamination. Such contamination may further degrade contact resistance.

Referring now to FIGS. 3–8, in yet another embodiment, an IC fabrication process, such as the method 10 of FIG. 1A, includes the use of a plasma treatment process prior to the removal of an etch stop layer. The plasma treatment enables borderless interconnections to be formed for an IC, such as the IC 20 of FIG. 2, while minimizing junction leakage and contact resistance degradation associated with plasma damage. It is understood that the thicknesses of layers provided in the present example are for illustrative purposes only, and that thinner or thicker layers may be desirable. Similarly, although specific materials are identified, other materials may be substituted, as is known in the art. Furthermore, it is understood that additional layers that are not shown may be used.

Figure 3:
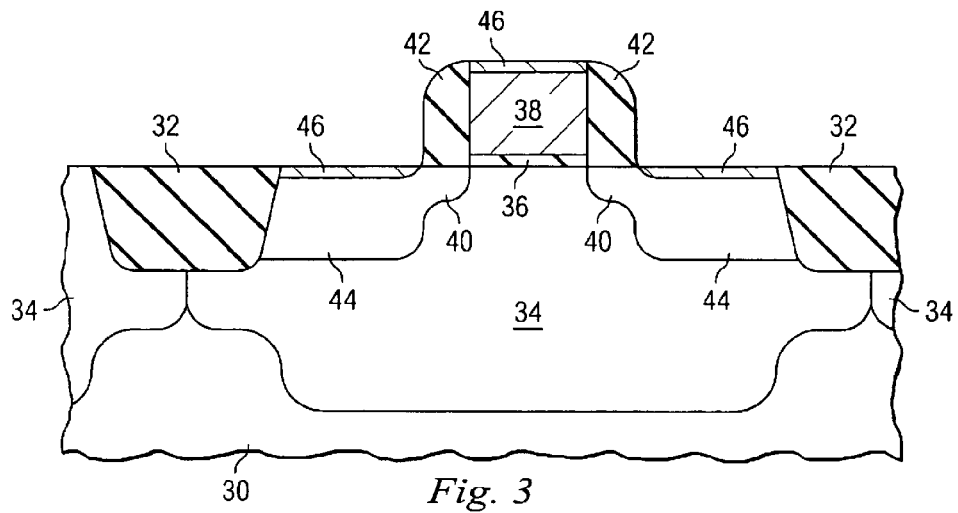
FIGS. 3–8 are cross-sectional views of an exemplary integrated circuit during a fabrication process that utilizes the method of FIG. 1A.

Referring specifically now to FIG. 3, the fabrication process begins by growing a thin, doped epi layer (not shown) on a semiconductor substrate 30. A field oxide is formed in the substrate 30 to electrically isolate device areas. In the present embodiment, with complementary metal oxide semiconductor (CMOS) technology of less than 0.25 $\mu$m, the field oxide is used to form a Shallow Trench Isolation (STI) structure 32. For example, the STI structure 32 may be created using a process sequence such as: growing a pad oxide, forming a low pressure chemical vapor deposition (LPCVD) nitride layer, patterning an STI opening using photoresist and masking, etching a trench in the silicon substrate, growing a thermal oxide trench liner to improve a trench interface, filling the trench with CVD oxide, using chemical mechanical planarization (CMP) to etch back, and using nitride stripping to leave the STI structure.

A well region 34 may be formed by ion implantation. For purposes of example, an N-well is illustrated. The well region 34 may be formed by growing a sacrificial oxide on the substrate 30, opening a pattern for the location of the N-well, and then using a chained-implantation procedure, as is known in the art.

A gate oxide 36 may then be formed, followed by the formation of a polysilicon gate structure 38 that comprises a layer of polysilicon deposited by LPCVD to a thickness of approximately 300–400 nm.

Source and drain extensions (SDEs) 40 (e.g., the lightly doped areas of the source and drain) in the substrate 30 may be formed by ion implantation. The implant dose is typically $3 \times 10^{13}$–$3 \times 10^{14}$ cm$^2$, or up to $1 \times 10^{15}$ cm$^{-2}$ for a submicron MOSFET.

A spacer 42 may be formed by LPCVD. The spacer may be formed by depositing an insulating material such as silicon nitride or silicon oxide. The deposited silicon nitride or silicon oxide layer may then be anisotropically etched back to form the spacer.

Heavily doped source/drain regions 44 may be formed by ion implantation using doses such as $1$–$5 \times 10^{15}$ cm$^{-2}$. These regions function as source and drain contact areas. A rapid thermal annealing (RTA) step may be used to activate the implanted dopants.

A metal silicide layer 46 may be formed on the polysilicon gate 38 and source/drain contact regions 44. The spacers 42 on the sidewalls of the polysilicon gate 38 may define a self-aligned silicide (e.g., salicide) area in the processing sequence. A sequence to form the salicide may begin with the removal of any native oxide layer on the polysilicon gate 38 and source/drain contact regions 44. Metal (not shown) is blanket deposited by sputtering onto the substrate 30. As described previously, while various metals (e.g., titanium, tungsten, cobalt, nickel, platinum, and palladium) may be used to form a silicide, nickel silicide may be preferable if the IC is to have a feature size less than 0.13 $\mu$m.

A low temperature thermal annealing process may be used to react the metal and the underlying silicon on the polysilicon gate 38 and source/drain contact regions 44. The metal deposited on the field oxide and spacers 42 does not react with the underlying oxide or nitride layer, and so may be selectively removed by a metal etching solution such as an ammonia peroxide mixture (e.g., $NH_4OH+H_2O_2+H_2O$) in a following etching step, leaving behind the silicide layer 46 on the polysilicon gate 38 and source/drain contact regions 44. No lithography processing may be needed to pattern the metal silicide layer 46 for contact, as the metal silicide layer 46 may be aligned with the polysilicon gate 38 and source/drain areas 44 by the selective reaction and etching described above. The reacted silicide may be in metastable phase and so may need a second step RTA at a higher temperature that depends on the metal material and intended compound to form a stable silicide phase with reduced resistance. Some silicides, such as nickel silicide, may be formed with a one step RTA at a lower temperature.

Figure 4:
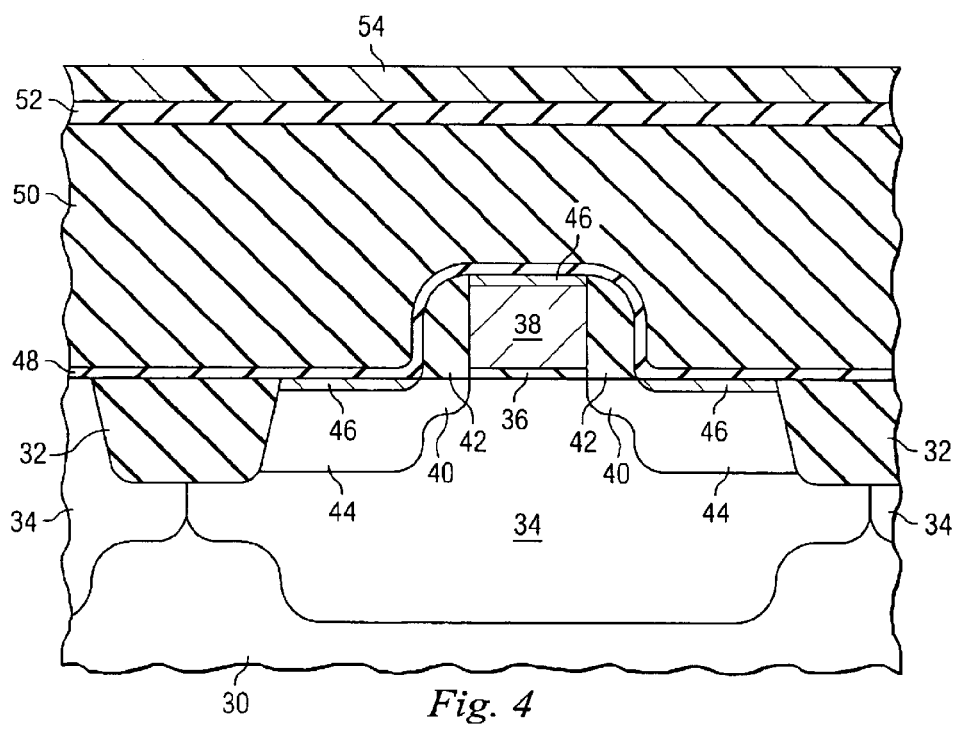

Referring now to FIG. 4, an etch stop layer 48 (e.g., a hard mask layer) may be blanket deposited to serve as a hard mask. The etch stop layer 48 may be silicon nitride ($Si_3N_4$) or silicon oxynitride (SiOH) with a thickness of approximately 200 to 600 Angstroms (Å). Such a silicon nitride or silicon oxynitride layer may be formed using plasma enhanced chemical vapor deposition (PECVD). The etch stop layer 48 may be used to define one or more interconnection holes, as will be described later.

After the deposition of the etch stop layer 48, an interlevel dielectric (ILD) layer 50 may be deposited at a thickness of 5000 to 10,000 Å. The ILD layer 50 may serve as an insulating layer. The ILD layer 50 typically comprises a layer of silicon oxide or borophosphosilicate glass (BPSG) formed by PECVD.

An insulator layer 52, comprised of silicon nitride or silicon oxynitride, may be deposited over the ILD layer 50 by a PECVD process similar to that used in forming the etch stop layer 48. The insulator layer 52 may have a thickness of about 500 to 3000 Å. In the present embodiment, the insulator layer 52 may have multiple functions. For example, the insulator layer 52 may serve as an anti-reflective coating (ARC) to optimize the resolution of photolithographic processing. In addition, the insulator layer 52 may serve as a hard mask to define contact holes during the following etch of the ILD layer 50 for contact openings.

A photoresist layer 54 may then be formed over the insulator layer 52 with a thickness of about 4000 to 6000 Å.

Figure 5:
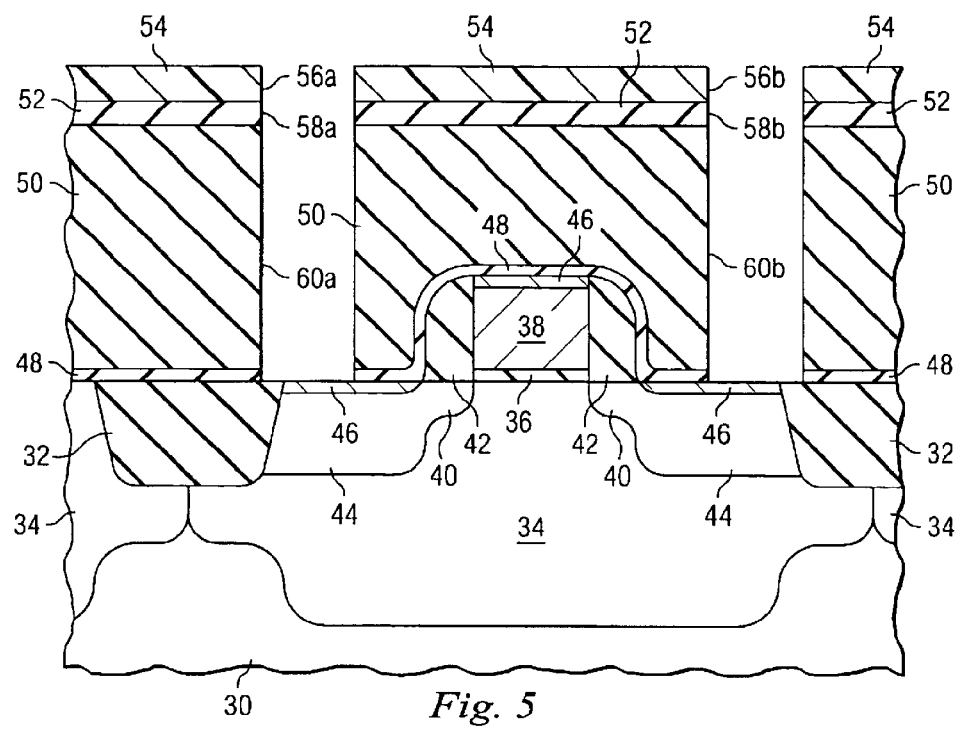

Referring now to FIG. 5, contact opening patterns 56a and 56b may be formed in the photoresist layer 54 by photolithographic processing. A first in situ etch step may then be used to etch the insulator layer 52 using a dry etch, transferring the contact opening patterns 56a, 56b from the photoresist layer 54 to the insulator layer 52, and resulting in openings 58a, 58b. In the present example, the dry etch may use anisotropic reactive ion etching (RIE) with a power between 1000 to 1500 watts and a pressure between 50 to 100 mtorr, with an etch ambient between about 50 to 100 standard cubic centimeters per minute (sccm) of $CF_4$, between about 5 to 20 sccm of $O_2$, and between about 80 to 200 sccm of argon.

The second in situ dry etch step is to etch contact openings 60a, 60b in the ILD layer 50 until the etch stop layer 48 is reached. This may use an anisotropic RIE process with a power between 1000 to 2000 watts and a pressure between 40 to 70 mtorr with etch ambient between about 5 to 16 sccm of $C_4F_8$, between about 50 to 400 sccm of CO, between about 100 to 500 sccm of argon, and between about 1 to 10 sccm of $O_2$.

After the openings are etched, a plasma treatment may be performed on the stop layer 48 before its removal. The plasma treatment may use, for example, nitrogen ($N_2$), $N_2$/Ar, $N_2$/$H_2$, or $NH_3$. Since the metal silicide layer 46 (which is nickel silicide in the present example) can be easily damaged by oxygen-contained plasma during the removal of the etch stop layer 48, the etch stop layer 48 may first be passivated by the plasma treatment. This makes the etch stop layer 48 more responsive to etching (e.g., it may be etched more quickly and evenly) and so may minimize damage to the nickel silicide layer 46 during the removal of the etch stop layer 48.

When nitrogen is used for the plasma treatment, the amount of free silicon (e.g., silicon having dangling bonds) in the silicon nitride of the etch stop layer 48 may be decreased. This reduces the number of reactions between dangling silicon in the etch stop layer 48 and oxygen, making the etch stop layer 48 easier to etch uniformly in the following etch step and reducing the damage to the nickel silicide layer 46 that may be caused by the use of over-etching needed to completely remove the etch stop layer 48. In addition, because nitrogen is an inert gas, the plasma treatment may help to remove polymer contamination caused by dry etching. In the present example, the plasma treatment occurs for between 10 and 60 seconds with an ambient pressure of 0.05 torr and a temperature between 50 and 150° C.

The etch stop layer 48 may then be removed using a linear removal method (LRM) or other suitable process after the plasma treatment. For example, in some embodiments, the etch stop layer 48 may be removed by sputtering, which may also be used to clean the native oxide before a barrier layer is deposited as described below.

Figure 6:
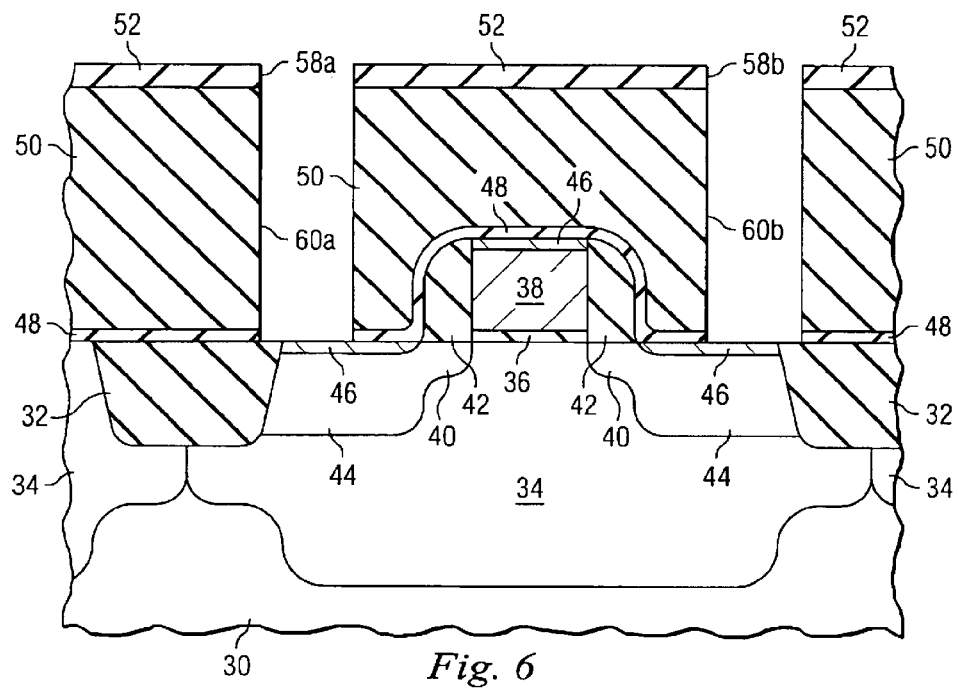

Referring now to FIG. 6, the photoresist layer 54 may be removed using a wet resist stripping process instead of resist ashing. This aids in avoiding damage to the nickel silicide layer 46. Examples of the wet resist stripping solution include $DI/O_3$, $NH_4OH/DI/O_3$, a sequence of SPM+APM, or a sequence of APM+SPM+APM, where DI is deionized water, APM is an ammonia peroxide mixture ($NH_4OH$ and $H_2O_2$), and SPM is a sulphuric peroxide mixture ($H_2SO_4$ and $H_2O_2$).

It is understood that the removal of the etch stop layer 48 and the photoresist layer 54 may be accomplished in a different order. For example, the photoresist layer 54 may first be removed using a wet resist stripping process, which may be performed more quickly due to the plasma treatment. The etch stop layer 48 may then be removed by argon (Ar) sputtering or another sputtering process, as is illustrated in the method 15 of FIG. 1B.

Figure 7:
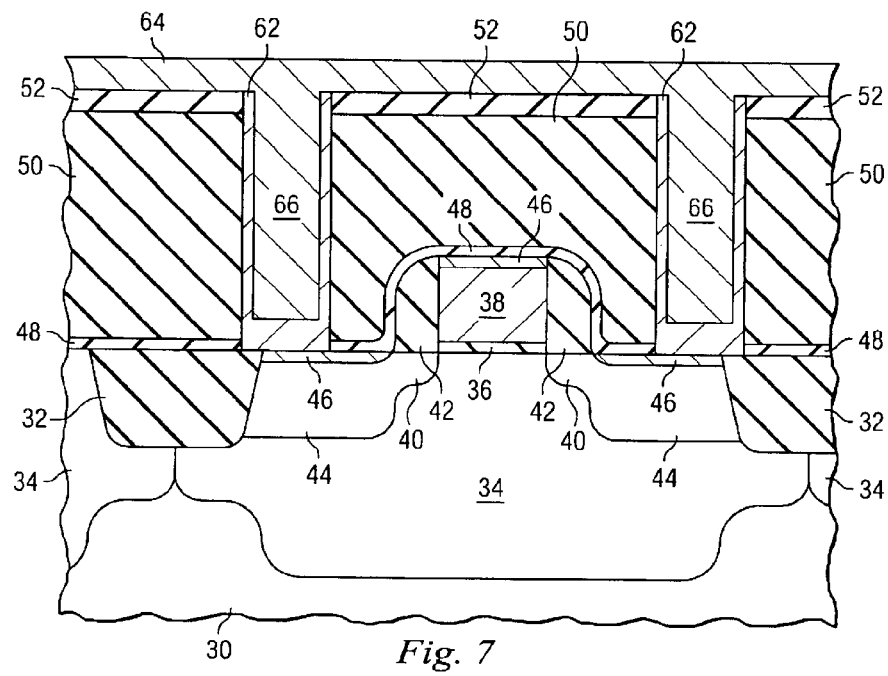

Referring now to FIG. 7, Ar sputtering etching may be used to remove any native oxide on the silicide in the contact holes. This cleans the contact openings and aids in the formation of a reliable contact with low contact resistance.

A barrier layer 62 may then be deposited by either PVD sputtering or CVD. Such a barrier layer may have multiple functions. For example, the barrier layer 62 may stop any diffusion that leads to junction spiking failure. Furthermore, the barrier layer 62 may serve as an adhesion layer to improve the adhesion strength between later-added tungsten (W) and the contact silicide and wall. Although shown as a single layer, the barrier layer 62 may comprise two layers: a layer of titanium (Ti) and another layer of titanium nitride (TiN). The relatively thin layer of Ti (30–50 nm) may be used under the layer of TiN (which serves as an adhesion layer) because Ti generally provides lower contact resistance.

A layer of CVD tungsten 64 may then be blanket deposited. Generally, the contact holes should be completely filled with a tungsten plug 66. This process may occur in two steps, with a thin layer of tungsten nucleated using silane reduction, followed by a hydrogen reduction reaction that is used to deposit the remainder of the blanket deposited tungsten layer.

Figure 8:
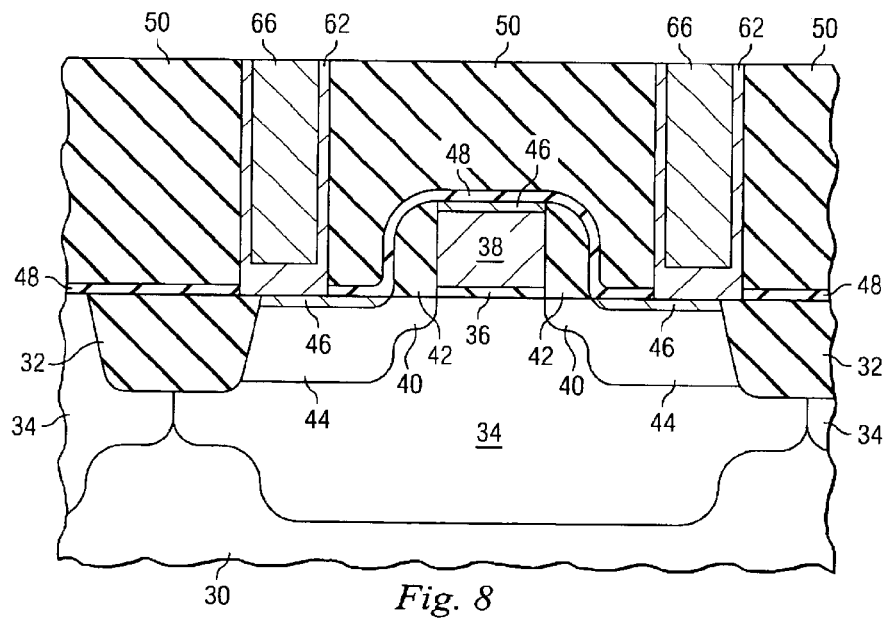

Referring now to FIG. 8, CMP processing may be used to polish the wafer surface mechanically and chemically, which removes the ARC layer 52 and deposited tungsten until the ILD layer 50 is reached. The wafer surface may then be globally planarized to optimize the surface for later photolithographic and metallization processing.

While the preceding description shows and describes one or more embodiments, it will be understood by those skilled in the art that various changes in form and detail may be made therein without departing from the spirit and scope of the present disclosure. For example, while the present disclosure illustrates the use of a plasma treatment during the fabrication of borderless interconnections, it is understood that the plasma treatment may be utilized in many other fabrication processes. Therefore, the claims should be interpreted in a broad manner, consistent with the present disclosure.

What is claimed is:

1. A method for forming an opening, the method comprising:
    providing a dielectric layer on a substrate;
    forming a patterned photoresist layer on the dielectric layer, wherein at least a portion of the dielectric layer is exposed through the patterned photoresist layer;
    etching the exposed portion of the dielectric layer;
    performing a plasma treatment on the photoresist layer using a nitrogen-based gas; and
    performing a wet strip to remove the patterned photoresist layer.

2. The method of claim 1 wherein the plasma treatment is selected to remove a by-product formed on the patterned photoresist layer during the etching.

3. The method of claim 1 wherein using a nitrogen-based gas includes using at least one of N2, N2/Ar, N2/H2, or NH3.

4. The method of claim 1 wherein performing the wet strip includes using a wet resist stripping solution comprising at least one of DI/O3, NH4OH/DI/O3, a sequence of SPM+APM, or a sequence of APM+SPM+APM, wherein DI is deionized water, APM is an ammonia peroxide mixture (NH4OH and H2O2), and SPM is a sulphuric peroxide mixture (H2SO4 and H2O2).

5. A method for fabricating a borderless interconnection in a semiconductor device, wherein the device includes a photoresist layer defining a contact mask, an interlevel dielectric (ILD) layer, a stop layer, and a metal silicide layer, the method comprising:

etching the ILD layer to expose at least a portion of the stop layer, wherein the etching is guided by the contact mask;

performing a plasma treatment on the exposed portion of the stop layer;

removing at least the exposed portion of the stop layer to expose a portion of the metal silicide layer;

stripping the photoresist;

depositing a barrier layer over the exposed portion of the metal silicide layer; and planarizing any layers above the ILD layer to expose the ILD layer.

6. The method of claim 5 wherein the barrier layer is deposited using a chemical vapor deposition process.

7. The method of claim 5 wherein the planarizing is accomplished using a chemical mechanical planarization process.

8. The method of claim 5 wherein a sputtering process is used in removing the exposed portion of the stop layer.

9. The method of claim 5 wherein a dry etch process is used in removing the exposed portion of the stop layer.

10. The method of claim 5 wherein performing the plasma treatment includes using at least one of N2, N2/Ar, N2/H2, or NH3.

11. The method of claim 5 wherein stripping the photoresist includes using a wet resist stripping solution comprising at least one of DI/O3, NH4OH/DI/O3, a sequence of SPM+APM, or a sequence of APM+SPM+APM, wherein DI is deionized water, APM is an ammonia peroxide mixture (NH4OH and H2O2), and SPM is a sulphuric peroxide mixture (H2SO4 and H2O2).

12. A method for fabricating an opening in a semiconductor device, wherein the device includes upper, middle, and lower layers, the method comprising:

removing at least a portion of the upper layer to expose a corresponding portion of the middle layer;

performing a plasma treatment on the exposed portion of the middle layer using a nitrogen-based plasma; and removing the exposed portion of the middle layer using a wet strip process, wherein damage to the lower layer is minimized due to the plasma treatment.

13. The method of claim 12 wherein removing the upper layer includes using a dry etch process.

14. The method of claim 12 further comprising:

depositing a photoresist layer above the upper layer, wherein the photoresist layer defines a pattern that controls the removing of the upper layer; and removing the photoresist layer using a wet stripping process.

15. The method of claim 14 wherein removing the middle layer includes using a dry etch process.

16. The method of claim 14 wherein removing the middle layer includes using a sputtering process.

17. The method of claim 12 further comprising depositing the upper, middle, and lower layers in a contiguous manner on a substrate.

18. A method for minimizing damage to a semiconductor device while creating an opening in the device, wherein the device includes an etch stop layer that is contiguous with an underlying metal silicide layer, the method comprising:

applying a nitrogen plasma treatment to at least a portion of the etch stop layer; and removing the treated portion of the etch stop layer to expose a portion of the underlying metal silicide layer, wherein the plasma treatment reduces damage to the underlying metal silicide layer that occurs during the removing of the treated portion of the etch stop layer.

19. The method of claim 18 wherein the etch stop layer is removed using a dry etch process.

20. The method of claim 18 wherein the etch stop layer is removed using an argon sputtering process.

21. The method of claim 18 wherein applying the nitrogen plasma treatment includes using at least one of N2, N2/Ar, N2/H2, or NH3.

22. The method of claim 18 further comprising:

depositing the etch stop layer, wherein the etch stop layer comprises silicon nitride or silicon oxynitride; and depositing the metal silicide layer, wherein the metal silicide layer comprises nickel silicide.

23. The method of claim 22 further comprising:

depositing an interlevel dielectric (ILD) layer above the etch stop layer;

depositing a photoresist layer above the ILD layer, wherein the photoresist layer defines a pattern that controls removing the ILD layer; and removing the ILD layer according to pattern, wherein the removal of the ILD layer defines the portion of the etch stop layer to which the nitrogen plasma treatment is applied.

24. The method of claim 23 further comprising removing the photoresist layer using a wet stripping process.

25. The method of claim 23 further comprising degrading residual matter left after the ILD layer is removed, wherein the degrading is accomplished using the nitrogen plasma treatment.

26. The method of claim 23 further comprising:

depositing a barrier layer on the exposed portion of the metal silicide layer;

depositing a blanket metal layer on the barrier layer; and planarizing a portion of the metal blanket layer to expose the ILD layer.

* * * * *